United States Patent [19]

Nagayama et al.

[11] Patent Number: 5,419,809
[45] Date of Patent: May 30, 1995

[54] DRY ETCHING METHOD

[75] Inventors: Tetsuji Nagayama; Toshiharu Yanagida, both of Kanagawa, Japan

[73] Assignee: Sony Corporation, Tokyo, Japan

[21] Appl. No.: 190,535

[22] Filed: Feb. 2, 1994

[30] Foreign Application Priority Data

Feb. 1, 1993 [JP] Japan .................................. 5-014983

[51] Int. Cl.⁶ .......................................... H01L 21/00
[52] U.S. Cl. ................... 156/662.1; 156/643; 156/646; 156/656; 156/664
[58] Field of Search ............... 156/643, 646, 665, 664, 156/662, 656

[56] References Cited

FOREIGN PATENT DOCUMENTS 53-146939 12/1978 Japan .
5-304123 11/1993 Japan .

OTHER PUBLICATIONS

Hikosaka et al. "Selective Dry Etching of AlGaAs–GaAs Heterojunction", Japanese Journal of Applied Physics, vol. 20, No. 11, Nov. 1981, pp. L847–L850.

Primary Examiner—R. Bruce Breneman
Assistant Examiner—George Goudreau
Attorney, Agent, or Firm—Hill, Steadman & Simpson

[57] ABSTRACT

A selecting anisotropic etching method for a GaAs/AlGaAs stacked system is disclosed. In a process for forming a recess for an HEMT gate, an $n^+$—GaAs layer on an $n^+$—AlGaAs layer is etched using a COS (carbonyl sulfide) /$SF_6$/ $CL_2$ mixed gas. The etching proceeds with radicals $F^*$ and $Cl^*$ as main etchants. On the other hand, carbonyl groups and C–O linkages derived from COS are introduced into a sputtered product of the resist mask for producing a carbonaceous polymer having a tough structure. The carbonaceous polymer forms a sidewall protective layer in conjunction with sulphur yielded from COS to contribute to anisotropic etching. It is possible with the present method to diminish the amount of the carbonaceous polymer necessary for procuring anisotropy to assure high selectivity, low pollution and low damage process.

13 Claims, 2 Drawing Sheets

DRY ETCHING METHOD

BACKGROUND OF THE INVENTION

This invention relates to a dry etching method applied to the manufacture of semiconductor devices. More particularly, it relates to a method for selective anisotropic etching of a stacked system of a compound semiconductor not containing aluminum and a compound semiconductor containing aluminum, as typified by a GaAs/AlGaAs stacked system.

A monolithic micro-wave IC (MMIC), produced by stacking GaAsMes-FETs (metal semiconductor field effect transistors) into an integrated circuit, is superior in response to high speed and high frequency and in low power consumption and hence has become popular as devices for communication between moving objects or satellite communication.

There has also been known a high electron mobility transistor (HEMT) which has also realized the response to a higher speed and a higher frequency of the GaAsMes —FET. The HEMT takes advantage of the properties of a two-dimensional electron gas of the GaAs compound semiconductor of being able to travel at a fast speed on the hetero junction interface without being scattered by impurities. For implementing the high degree of integration with the HEMT, the necessity arises for a dry etching technique which renders it possible to perform etching with higher accuracy and higher selectivity.

Above all, during the process of selectively etching the GaAs/AlGaAs stacked system for forming a gate recess, it is crucial that the etching be performed with high precision and a high selectivity ratio. The reason may be summarized as follows. In a hereto-junction FET, such as HEMT or hereto MIS structure FET, the threshold voltage is determined by the thickness or the concentration of impurities of the lower AlGaAs layer. Thus the concentration of impurities and the thickness of the AlGaAS layer are pre-set depending on the desired threshold voltage. However, during the process of removing the upper GaAs layer for forming the gate recess, if the selectivity ratio for etching is insufficient such that over-etching or the like is caused, the thickness of the AlGaAS layer tends to be changed, with the consequence that the threshold voltage of the resulting hereto-junction FET tends to be deviated from the desired threshold voltage.

The selective etching of the GaAs layer on the AlGaAs layer is performed by reactive ion etching (RIE) using a gas mixture composed of a CFC gas and a rare gas. Thus an example of employing a mixed gas of $CCL_2F_2$/He is described in Japanese Journal of Applied Physics, Vol. 20, No. 11 (1981), p. L847 to 850. With the reactive ion etching, making use of the mixed gas of $CCL_2F_2$/He, the GaAs layer is removed by Ga mainly forming a chloride and by As forming a fluoride and chloride. When etching reaches the underlying AlGaAs layer, $AlF_x$ (aluminum fluoride) having a low vapor pressure is produced on the exposed surface to terminate or decelerate the etching. In the above-mentioned publication, disclosing such technique, the selectivity ratio is reported as being approximately 200. On the other hand, the anisotropic shape of the gate recess is maintained because the sidewall surface of the pattern is protected by the deposition of a carbonaceous polymer derived from the decomposition product of the $CCl_2F_2$ gas or from the resist mask.

Meanwhile, if $CCl_2F_2$ is released to an external environment, there arises the risk of destruction of an ozone layer in the stratosphere. It is therefore preferred that the use of such $CCl_2F_2$ be avoided as far as possible in view of protection of the earth's environment, and hence it is preferred that the use of the CFC based gases such as $CCl_2F_2$ be avoided as far as possible.

In the dry etching employed for fabrication of semiconductor devices, it has been proposed to use so-called substitution freon having a shorter life in the stratosphere, such as hydro chlorofluoro carbon (HCFC), in place of the above-mentioned CFC gas.

However, the substitution freon causes a problem similar to that with CFC based gas because of the organic halogen compound making up the substitution freon. This problem consists in the tendency towards increase in particle contamination due to the carbonaceous polymer generated in a gas phase under discharge dissociation conditions. It is difficult to control the generated amount of the carbonaceous polymer, which is deposited on the resist mask surface or on the pattern sidewall surface to contribute to improved resist selectivity and shape anisotropy, such that, if a fine pattern of a high density is to be formed, the disc substrate tends to be destroyed by shorting.

If the carbonaceous polymer is to be employed for achieving sufficient selectivity and anisotropy for establishing a method for producing a semiconductor device not employing an organic halogen compound gas, one has to resort to a resist mask as a supply source for the carbonaceous polymer. However, if the resist mask is sputtered with ions having a high incident energy, with a view to supplying a necessary amount of the carbonaceous polymer, the resist selectivity tends to be lowered to produce a critical dimensional loss, while it is also not possible to prevent damages to the underlying layer or generation of particle contamination.

For achieving protection of the wafer surface while preventing particle contamination and suppressing etching damages, it is effective to intensify the properties of the membrane of the carbonaceous polymer itself to permit a sufficiently high wafer surface protective effect to be displayed despite a decreased amount of polymer deposition and to substitute another material unlikely to become a source of contamination for a part of the carbonaceous material for avoiding the dependency solely on the inhibitive effect of the carbonaceous polymer.

SUMMARY OF THE INVENTION

In view of the above-depicted status of the art, the present invention provides a dry etching method in which an Al-free compound semiconductor layer stacked on an Al-containing compound semiconductor layer formed on a substrate is etched using an etching gas containing carbonyl sulfide and at least one halogen compound.

According to the present invention, at least one of halogen compounds contained in the etching gas is a fluorine compound capable of yielding at least fluorine-based active species under conditions of electrical discharge dissociation.

According to the present invention, the etching is carried out in two steps, that is a just-etching step of etching substantially the thickness of the Al-free compound semiconductor layer, and an overetching step of etching its residual portion. During the overetching step, the contents ratio of the fluorine compound in the etching gas is increased so as to be higher than that used for the just-etching step.

The fluorine-based compound contained in the etching gas is at least one sulphur fluoride selected from the group consisting of $S_2F_2$, $SF_2$, $SF_4$ and $S_2F_{10}$.

The halogen compound is at least one sulphur halogenide selected from the group consisting of $S_3Cl_2$, $S_2Cl_2$, $SCl_2$, $S_3Br_2$, $S_2Br_2$ and $SBr_2$.

The etching gas employed in the present invention is a gas which yields nitrogen-based active species under electrical dissociation conditions.

With the dry etching method of the present invention, carbonyl sulfide (COS) is employed as one of main components of the etching gas. COS has a linear molecular structure of the O=C=S type, with the carbonyl group in the molecule exhibiting high polymerization promoting activity to raise the polymerization degree of the carbonaceous polymer to improve resistance against ion impingement or aggression by radicals. Besides, if the carbonyl group is introduced into the carbonaceous polymer, the resulting polymer is improved in chemical stability and in physical stability as compared to the conventional carbonaceous polymer composed of recurrence of —$CX_2$—units. The reason is that the binding energy between two molecules is equal to 1077 kJ/mol which is significantly higher than the corresponding value for the C—C linkage which is 607 kJ/mol.

In addition, the carbonaceous polymer is improved in polarity by the addition of the carbonyl group and exhibits electrostatic attraction with respect to the negatively charged wafer to improve the surface protective effect of the carbonaceous polymer.

Besides, COS yields sulphur (S) under electrical dissociation conditions. Sulphur thus yielded is deposited on the wafer surface if the wafer is controlled in temperature to lower than the room temperature to contribute to sidewall protection and surface protection of the exposed surface of the Al-containing compound semiconductor layer. Sulphur may also be sublimed off by heating the wafer to approximately higher than 90° C. after the end of the etching. At any rate, sulphur is not liable to become a source of particle contamination.

Since the membranous quality of the carbonaceous polymer itself is strengthened in this manner, an expectation may be made of sulphur deposition, it is possible with the present method to decrease the incident ion energies required for anisotropic etching to improve resist selectivity. Besides, since the amount of deposition of the carbonaceous polymer as required for achieving high anisotropy and high selectivity may be decreased, particle pollution may be decreased.

The decrease in the incident ion energies leads naturally to improved selectivity.

Meanwhile, at least one halogen compound is also contained besides COS in the etching gas of the present invention. Such halogen compound is required as a supply source of a halogen-based active species acting as a main etchant for the Al-free compound semiconductor layer.

Above all, if underlying layer selectivity is to be achieved depending on the generation of $AlF_x$, as in the case of the GaAs/AlGaAs stacked system, it is necessary that at least one of the halogen compounds be a fluorine compound, and fluorine-based active species be supplied to the etching reaction system.

Besides, since the underlying layer selectivity is most crucial in the vicinity of the stacked interface between the Al-free compound semiconductor layer and the Al-containing compound semiconductor layer, the underlying layer selectivity may be effectively improved by increasing the generated amount of the fluorine-based active species in the etching reaction system immediately before substantial exposure of the underlying Al-containing compound semiconductor layer is achieved. It is for this reason that the contents ratio of the fluorine compound in the etching gas should be increased in the present method for the overetching step as compared to that for the just-etching step.

If any of sulfur fluorides selected from the group consisting of $S_2F_2$, $SF_2$, $SF_4$ and $S_2F_{10}$ is employed, expectation may be made of a further increase in the amount of sulphur deposition. Sulphur thus deposited shows a behavior similar to that of sulphur yielded from COS. That is, by employing COS in conjunction with sulphur fluoride, sulphur deposition may be increased to reduce further the contribution of the carbonaceous polymer in achieving selectivity and anisotropy.

However, if the halogen-based active species present in the etching reaction system are solely the fluorine-based active species, there is the risk that reaction products with a high vapor pressure cannot be produced depending on the kinds of the constituent elements of the compound semiconductor layer, with the result that the etch rate is lowered acutely. Consequently, it becomes necessary to consider using halogen-based compounds capable of yielding other halogen-based active species, such as chlorine or bromine.

Sulphur halogenides employed in the method of the present invention, such as $S_3Cl_2$, $S_2Cl_2$, $SCl_2$, $S_3Br_2$ and $SBr_2$, are the compounds selected with the above in mind. Similarly to the above-mentioned sulphur fluorides, these sulphur halogenides yield sulphur, and hence contribute to reduction in the amount of the carbonaceous polymer.

Meanwhile, the etching gases employed in the method of the present invention yield sulphur under conditions of electrical discharge dissociation. If the etching gases are further capable of yielding nitrogen-based active species, these species are reacted with sulphur to yield various sulphur nitride compounds to improve further the surface protective effect. The reason is that polythiadyl $(SN)_x$, as a main constituent of the sulphur nitride compounds, includes a chain of recurrent covalent bonds S—N—S—N—... thus exhibiting higher resistance against the attack by ions or radicals than sulphur itself. Besides, the sulphur nitride compounds may be easily sublimed off or decomposed and removed by heating the wafer to approximately 130° C. or higher after the end of etching.

Consequently, if the sulphur nitride compound is yielded, the amount of yield of the carbonaceous polymer necessary for maintaining the selectivity may be reduced further to achieve low damage and low contamination.

DETAILED DESCRIPTION OF THE PREFERRED EMBODIMENTS

Examples

The present invention will be explained with reference to illustrative Examples which are not intended for limiting the invention.

EXAMPLE 1

In the present Example, the present invention is applied to formation of a gate recess for an HEMT by etching an n+ —GaAs layer on an n+ —AlGaAs layer using a COS/SF$_6$/Cl$_2$ gas mixture. The present process is explained by referring to FIGS. 1 to 3.

Figure 1:
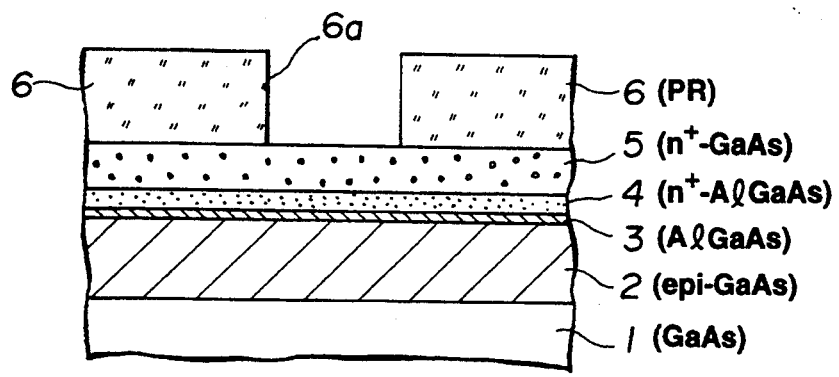
FIG. 1 is a schematic cross-sectional view showing a wafer in which a resist mask is formed on a n+ —GaAs layer in the course of producing a gate recess for an HEMT.

The wafer used as an etching sample in the present embodiment comprises an epi-GaAs layer 2, formed by epitaxial growth on a semi-insulating GaAs substrate 1 for functioning as a buffer layer, an AlGaAs layer 3 about 2 nm in thickness, an n+ —AlGaAs layer 4 about 30 nm in thickness, doped with an n type impurity, such as Si, an n+ —GaAs layer 6, about 100 nm in thickness, containing an n-type impurity, and a resist mask (PR) 6 patterned to a pre-set shape, stacked in this order, as shown in FIG. 1. The patterning of the resist mask 6 is by light exposure by electron beam drawing and development, with an opening diameter of an opening 6a being approximately 300 nm.

For etching the n+ —GaAs layer 5, the wafer was set on a magnetic micro-wave plasma etching unit of the type supplied with an RF bias voltage. The following are typical etching conditions:

| | |
| --- | --- |
| COS flow rate: | 10 SCCM |
| SF$_6$ flow rate: | 5 SCCM |
| Cl$_2$ flow rate: | 10 SCCM |
| gas pressure: | 0.67 Pa |
| micro-wave power: | 850 W (2.45 GHz) |
| RF bias power: | 30 W (2 MHz) |
| wafer temperature: | −20° C. |

The radicals F* generated from SF$_6$ extracts AS from the n+ —GaAs layer 5 in the form of AsF$_3$ or AsF$_5$, whereas the radicals Cl* generated from Cl$_2$ extract As and Ga in the form of AsCl$_3$ or GaCl$_3$. These radical reactions are assisted by incident energies of ions such as CO+, SF$_x$+ or Cl$_x$+.

Figure 2:
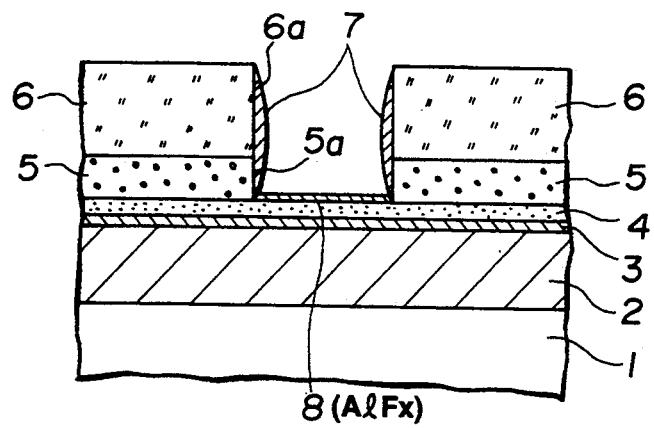
FIG. 2 is a schematic cross-sectional view showing a wafer in which a recess has been formed by etching on the n+ —GaAs layer of FIG. 1 and a sidewall protective film and an AlF$^x$ layer have been formed on the pattern sidewall surface and on an exposed surface of the n+ —AlGaAs layer, respectively.
Figure 3:
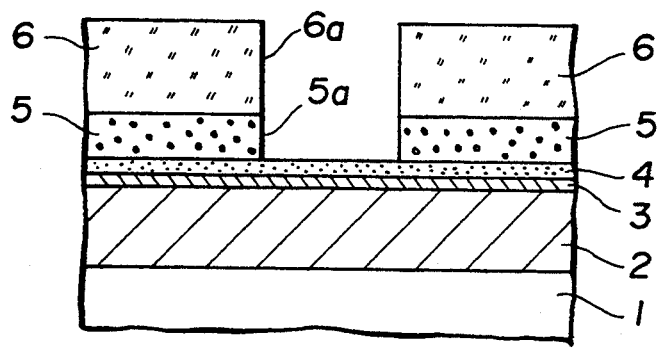
FIG. 3 is a schematic cross-sectional view showing the state in which the sidewall protective film and the AlF$_x$ layer have been removed.

Simultaneously, the resist mask 6 was sputtered by the above ions and the resulting decomposition compounds were polymerized to form CF$_x$ or CCl$_x$ polymers. Although these carbonaceous polymers are not produced in an amount less than that possible with the conventional process because of a lower RF bias power, they are intensified in their structure by capturing C–O linkages or carbonyl groups derived from COS. These carbonaceous polymers form a sidewall protective film 7 shown in FIG. 2, with sulphur S produced by dissociation form COS, thus contributing to anisotropic etching. Although the sidewall protective film 7 is shown in FIG. 2 with an increased thickness for convenience sake, it is actually an extremely thin film such that it does not cause the critical dimensional loss.

Thus, by the strong sidewall protective effect by the intensified carbonaceous polymer and sulphur, a recess 5a having a satisfactory anisotropic shape could be formed even under low bias conditions. On the other hand, resist selectivity could be raised by a factor of two as compared with the conventional process thanks to the use of the low bias voltage.

When the underlying n+ —AlGaAs layer 5 is exposed with the progress of etching, an AlF$_x$ layer 8 was formed on the exposed surface, and etching was virtually terminated.

Then, for removing the AlF$_x$ layer 8, a short-term etching was performed under the following typical conditions:

| | |
| --- | --- |
| Cl$_2$ flow rate: | 30 SCCM |
| gas pressure: | 6.7 Pa (50 mTorr) |
| micro-wave power: | 500 W (2.45 GHz) |
| RF bias power: | 0 W |
| wafer temperature | −10° C. |

This AlF$_x$ removal process has been proposed by the present Assignee in JP Patent Application No. 4-240840 (1993). With the above-described etching, the AlF$_x$ layer 8 was removed by the operation of Cl*. Since the RF bias power was not applied at this time, there was inflicted no wasteful damage to the n+ —AlGaAs layer 4 even after exposure of the underlying n+ —AlGaAs layer 4.

The wafer was then heated to approximately 90° C. By this heating, sulphur S constituting the sidewall protective film 7 was sublimed off, at the same time as the carbonaceous polymer was exfoliated.

From this time on, the gate electrode was formed as conventionally. The process is now explained by referring to FIGS. 4 and 5.

Figure 4:
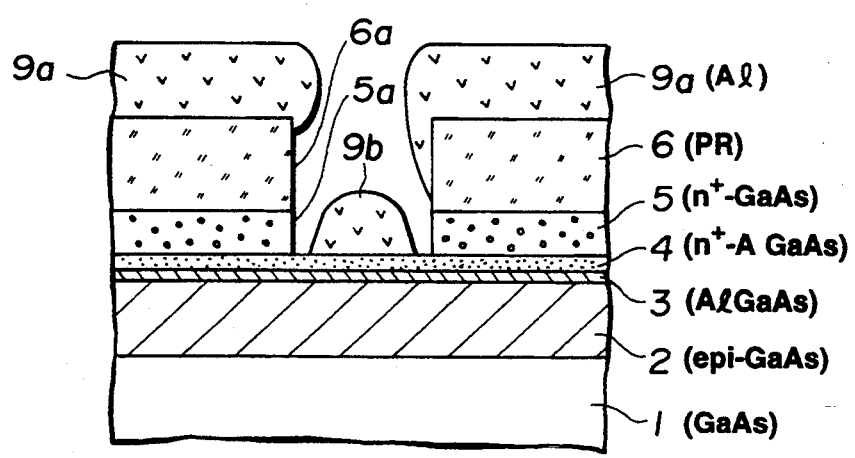
FIG. 4 is a schematic cross-sectional view showing the state of the wafer in which an upper Al layer and a lower Al layer have been deposited on the surface of the resist mask and on the bottom surface of the recess, respectively.

First, an Al layer approximately 200 nm in thickness was formed by electron beam deposition, as shown in FIG. 4. The deposition was performed by deftly taking advantage of the fact that step coverage is deteriorated in the inside of the recess 5a having a small opening diameter. By this process, an upper Al layer 9a was formed on the surface of the resist mask 6, while a lower Al layer 9b, which later becomes a gate electrode, was formed on the bottom of the recess 5a.

Figure 5:
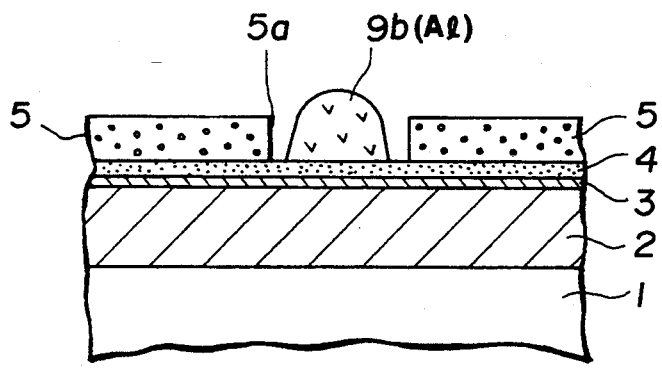
FIG. 5 is a schematic cross-sectional view showing the state of the wafer in which the resist mask and the upper Al layer thereon have been removed and the lower Al layer as a gate electrode is left only on the bottom of the recess.

Subsequently, when the resist mask 6 was lifted off, the Al layer 9a thereon was simultaneously removed, as shown in FIG. 5, so that only the lower Al layer 9b on the bottom of the recess 5a was left to complete the gate electrode.

EXAMPLE 2

In the present Example 2, the n+ —GaAs layer 5 was etched with the aid of a COS/NF$_3$/S$_2$Br$_2$ gas mixture for the similar production of the gate recess.

First, a wafer shown in FIG. 1 was set on a magnetic microwave plasma etching unit, and the n+ —GaAs layer 5 was etched under the following typical conditions:

| | |
|---|---|
| COS flow rate: | 10 SCCM |
| NF$_3$ flow rate: | 5 SCCM |
| S$_2$Br$_2$ flow rate: | 10 SCCM |
| gas pressure: | 0.67 Pa |
| micro-wave power: | 850 W (2.45 GHz) |
| RF bias power | 10 W |
| wafer temperature | −20° C. |

During the present process, etching of the n+ —GaAs layer 5 proceeded with radicals F* derived from NF$_3$ and radicals Br* derived from S$_2$Br$_2$ acting as main etchants. The mechanism of strengthening the CF$_x$ polymer or the CBr$_x$ polymer by COS and the mechanism of achieving underlying layer selectivity by the formation of the AlF$_x$ layer 8 are as described in connection with Example 1.

In the present Example, sulphur S is released not only from COS but from S$_2$Br$_2$ as well for intensifying sulphur deposition. Besides, part of sulphur is reacted with nitrogen yielded from NF$_3$ to generate polythiadyl (SN)$_x$. Thus, with the sidewall protective film 7, generated with the present Example, the strengthened carbonaceous polymer, S and (SN)$_x$ exist together to cause relative decrease of the proportion of the carbonaceous polymer. However, since the sidewall protective film 7 exhibits an extremely high sidewall protective effect, the recess 5a having a satisfactory anisotropic shape could be formed even although the RF bias power was lower than that with Example 1.

The subsequent process was carried out in substantially the same way as in Example 1, except that the wafer was heated to approximately 150° C. during removal of the sidewall protective film 7.

EXAMPLE 3

In the present Example 3, the etching of the n+ —GaAs layer 5 with the aid of the mixed gas of COS/SF$_6$/Cl$_2$ was divided into a just-etching process and an overetching process, and the content ratio of SF$_6$ was raised for the latter process for achieving high selectivity.

First, the wafer shown in FIG. 1 was set on a magnetic microwave plasma etching unit, and the n+ —GaAs layer 5 was just-etched under the same conditions as those of Example 1. The etching was terminated at a time point the underlying n+ —AlGaAs layer 4 started to be exposed.

The etching conditions were then changed over to the following typical conditions, and an overetching was performed for removing the residual portion of the n+ —GaAs layer 5.

| | |
|---|---|
| COS flow rate: | 10 SCCM |
| SF$_6$ flow rate: | 10 SCCM |
| Cl$_2$ flow rate: | 5 SCCM |
| gas pressure: | 0.67 Pa |
| micro-wave power: | 850 W (2.45 GHz) |
| RF bias power: | 10 W |
| wafer temperature | −20° C. |

The above conditions correspond to the conditions for the just-etching process in which the SF$_6$ flow rate and the Cl$_2$ flow rate are interchanged with each other. That is, with the present overetching process, the amount of generation of radicals F* in the plasma is increased for raising the efficiency in the formation of the AlF$_x$ on the exposed surface of the n+ —AlGaAs layer 4.

With the present Example, the underlying layer selectivity could be raised to about 1.5 times of that of Example 1.

Although the present invention has been described in connection with the three Examples, these are given merely for illustration and are not intended for limiting the invention.

First, although the GaAs/AlGaAs stacked system has been given in the above Examples as the stacked system of the compound semiconductor layer, the present method may be applied to any other prior-art stacked system of the compound semiconductor containing an Al layer as its lower layer. The present method may be applied to a two-component or three-component stacked system, such as GaP/AlGaP, InP/AlInP, GaN/AlGaN or InAs/AlInAs, or to a three component/four-component stacked system.

Besides, the present method may be applied to any process including the step of selective etching of the stacked system of an Al-free compound semiconductor/Al-containing compound semiconductor. Thus the present method may be applied not only to the manufacture of HEMTs but to the processing of quantum Hall devices or semiconductor laser devices as well.

The etching gas composition is also not limited to the above-cited composition. Besides SF$_6$ and NF$_3$, HF and ClF$_3$ may also be employed as fluorine compounds capable of supplying fluorine-based active species.

Besides Cl$_2$, mentioned above, BCl$_3$, BBr$_3$, HBr and Br$_2$ may also be employed as a supply source for halogen-based active species other than fluorine-based active species.

Besides NF$_3$, mentioned above, N$_2$, NO, N$_2$O, NO$_2$, NOCl (nitrile chloride), NO$_2$Cl (nitrosyl chloride), NOBr (nitrosyl bromide) or NO$_2$Br (nitrile bromide) may also be employed as a supply source for nitrogen-based active species. NH$_3$ is combined with sulphur to yield ammonium sulfide having a low vapor pressure and hence is not desirable.

It is to be noted in addition that the etching device employed, etching conditions or the constitution of the sample wafers may be optionally modified without departing from the scope of the invention.

What is claimed is:

1. A dry etching method of selectively etching an Al-free compound semiconductor layer formed on an Al-containing compound semiconductor layer, comprising providing a patterned masking layer on the Al-free compound semiconductor layer, and plasma etching exposed portions of the Al-free compound semiconductor layer using an etching gas containing carbonyl sulfide and at least one halide.

2. A dry etching method according to claim 1, wherein said at least one halide is a fluoride capable of releasing free fluorine under conditions of discharge dissociation.

3. A dry etching method according to claim 2, wherein said fluoride is at least one selected from the group consisting of SF$_6$, NF$_3$, HF and ClF$_3$.

4. A dry etching method according to claim 1, wherein said etching gas includes at least one kind of sulphur fluoride selected from the group consisting of S$_2$F$_2$, SF$_2$, SF$_4$ and S$_2$F$_{10}$.

5. A dry etching method according to claim 4 wherein said etching gas includes at least one kind of sulphur halide selected from the group consisting of $S_3Cl_2$, $S_2Cl_2$, $SCl_2$, $S_3Br_2$, $S_2Br_2$ and $SBr_2$.

6. A dry etching method according to claim 1, wherein said etching gas includes at least one kind of additive constituent capable of releasing free nitrogen under conditions of discharge dissociation.

7. A dry etching method according to claim 6, wherein said additive constituent comprises at least one selected from the group consisting of $NF_3$, $N_2$, $NO$, $N_2O$, $NO_2$, $NOCl$, $NOCl_2$, $NOBr$, and $NO_2Br$.

8. A dry etching method according to claim 1, wherein said etching process includes a first etching step of etching substantially the thickness of the Al-free compound semiconductor layer using a first etching gas containing carbonyl sulfide and a fluorine compound and a second etching step of etching a residual portion of said Al-free compound semiconductor layer left with the first etching step using a second etching gas having the contents of the fluorine compound higher than those of said first etching gas.

9. A dry etching method according to claim 1, wherein said Al-free compound semiconductor layer comprises one selected from the group consisting of GaAs, GaP, ZnP, GaN and ZnAs.

10. A dry etching method according to claim 1, wherein said Al-containing compound semiconductor layer comprises one selected from the group consisting of AlGaAs, AlGaP, AlZnP, AlGaN, and AlZnAs.

11. A dry etching method according to claim 1, wherein said etching gas includes at least one kind of sulfur halide selected from the group consisting of $S_3Cl_2$, $S_2Cl_2$, $SCl_2$, $S_3Br_2$, $S_2Br_2$, and $SBr_2$.

12. A dry etching method according to claim 1, wherein said etching gas includes an additive constituent capable of releasing free halogen under conditions of discharge dissociation.

13. A dry etching method according to claim 12, wherein said additive constituent is at least one selected from the group consisting of $Cl_2$, $BCl_3$, $HBr$, and $Br_2$.

* * * * *